United States Patent [19]

Prince

[11] 3,971,618
[45] July 27, 1976

[54] HOLDING DEVICE FOR MEASURING THE CAPACITY OF SMALL ELECTRICAL COMPONENTS

[75] Inventor: Paul O. Prince, Kensington, Md.

[73] Assignee: The United States of America as represented by the Secretary of the Army, Washington, D.C.

[22] Filed: Mar. 20, 1975

[21] Appl. No.: 560,653

[52] U.S. Cl. .......................... 339/143 R; 324/158 F; 339/255 R
[51] Int. Cl.² ........................................ H01R 13/12
[58] Field of Search .............. 339/17, 75, 143, 255; 324/158 D, 158 F, 158 P, 158 T

[56] References Cited
UNITED STATES PATENTS

| 2,812,508 | 11/1957 | Mullan | 339/255 P |
| 2,846,649 | 8/1958 | Hornauer | 339/278 C |
| 2,872,645 | 2/1959 | Santamaria et al. | 324/158 T |
| 3,340,473 | 9/1967 | Hertzler, Jr. | 339/255 P |
| 3,594,697 | 7/1971 | Azbell | 339/255 P |
| 3,858,959 | 1/1975 | Arnold | 339/75 M |

FOREIGN PATENTS OR APPLICATIONS 153,593  6/1932  Switzerland..................... 339/255 R

*Primary Examiner*—Joseph H. McGlynn
*Attorney, Agent, or Firm*—Nathan Edelberg; Robert P. Gibson; Saul Elbaum

[57] ABSTRACT

A device is provided for holding small electrical components so that their capacity may be accurately measured. The device is constructed in such a manner that the inherent or parasitic capacity of the device is extremely low, thus enabling the accurate measurement of elements having extremely low capacity. The device includes a support, two movable electrical contacts for holding an electrical component therebetween and a pair of electrically conductive springs for urging the contacts into an abutting relationship and for electrically connecting the contacts with a pair of output terminals.

7 Claims, 2 Drawing Figures

HOLDING DEVICE FOR MEASURING THE CAPACITY OF SMALL ELECTRICAL COMPONENTS

The invention described herein can be manufactured, used and licensed by or for the United States Government for governmental purposes without the payment to me of any royalty thereon.

BACKGROUND OF THE INVENTION

The present invention relates generally to devices for holding electrical components for measurement and more particularly to a device for holding small electrical components so that their capacity may be measured.

In the design of prototypes for experimental circuits, it is frequently necessary to know the capacity of the various electrical components being utilized therein. In the last few years, however, as electrical components have become increasingly miniaturized, problems have arisen in the accurate measurement of the capacity of these miniaturized components, such as chip capacitors. First of all, no device has been available for securely holding these components while at the same time making good electrical contact with the component and not in any way damaging the component. In the past, it has been necessary to attach measurement wire leads to the component with solder or epoxy, and then remove the wires when placing the component in the desired circuit. This process is cumbersome, time consuming, yields somewhat inconsistent and inaccurate results and frequently results in damage to the component. Additionally, no device has been available for holding miniaturized electrical components wherein the capacitance of the holding device itself was not large with respect to the capacitance of a component being measured. In such a case, it is extremely difficult (if not impossible) to obtain an accurate measurement of the capacitance of the component being measured.

SUMMARY OF THE INVENTION

The present invention provides a device for holding small electrical components which includes a support means, first and second movable electrical contacts for holding an electrical component therebetween, first and second electrically conductive output terminals supported by the support means, and electrically conductive spring means for urging the electrical contacts into an abutting relationship to thereby hold the electrical component between the first and second electrical contacts. The spring means is connected to the first and second electrical contacts and the first and second output terminals to thereby electrically connect the electrical component with the first and second output terminals.

OBJECTS OF THE INVENTION

An object of the present invention is the provision of a device for holding small electrical components in a secure manner without in any way damaging the electrical component.

Another object of the present invention is the provision of a device for holding small electrical components which will make good electrical contact with the component being held and will provide a substantial amount of consistency between successive measurements.

A further object of the present invention is the provision of a device for holding small electrical components, which device has a very low inherent capacitance.

A still further object of the present invention is the provision of a device for holding small electrical components which provides adequate electrostatic shielding for the components and the device.

Other objects, advantages and novel features of the present invention will become apparent from the following detailed description of the invention when considered in conjunction with the accompanying drawings.

DESCRIPTION OF THE PREFERRED EMBODIMENT

Figures 1, 2:
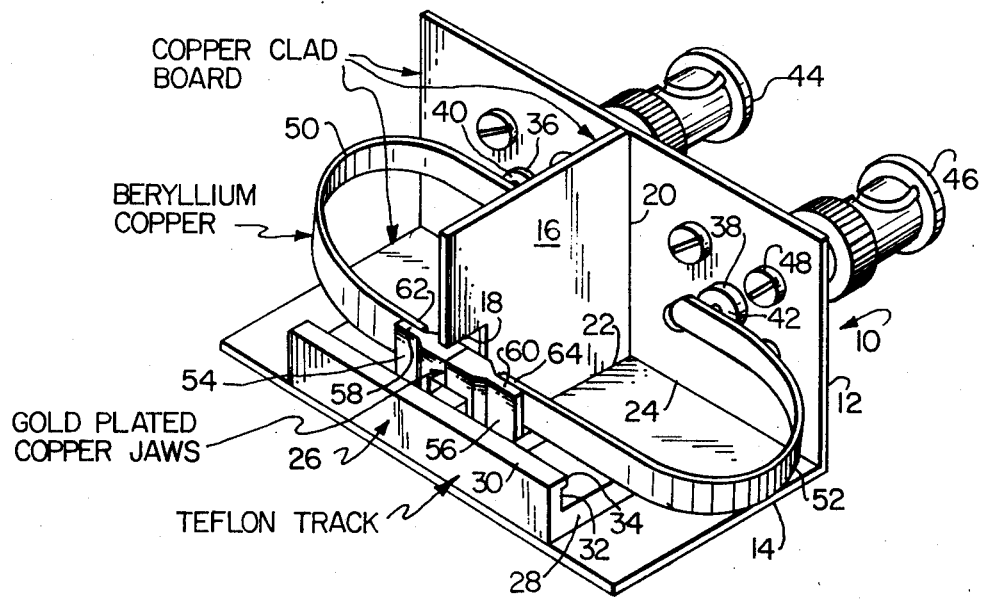
FIG. 1 shows a pictorial view of the holding device of the present invention.
FIG. 2 shows a pictorial partial cutaway view of the jaws and track of the holding device of the present invention.

The preferred embodiment of the present invention will now be described in connecion with FIGS. 1 and 2 of the drawings. The holding device of the present ivention is structured about a support means generally indicated at 10 which includes a first planar member 12 and a second planar member 14. The planar members 12 and 14 are perpendicular to one another. The support means 10 further includes a third planar member 16 which is perpendicular to both of the first two planar members 12 and 14 and divides the support means 10 substantially in half. In the preferred embodiment of the present invention, the support members 12, 14 and 16 are copper-clad circuit boards. The circuit board may be any standard Bakelite (a trademark of the Union Carbide Corporation) circuit board. The copper-cladding serves to electrostatically shield all components within the support means 10. In the alternative, the support means 10 could be constructed of any material that is sturdy and will function successfully as an electrostatic shield, such as sheet metals. The support member 16 further includes a cut-out portion 18. The planar members 12, 14 and 16 are preferably soldered at their joining edges 20, 22 and 24.

A guide means 26 is securely attached to the planar support member 14 by means of any suitable adhesive. The guide means includes a base 28 which rests on the support member 14 and a track portion 30 which includes a side wall 32 which is perpendicular to the base 28 and a linear lip portion 34 which is perpendicular to the side wall 32. The guide means 26 is preferably made of Teflon, however, any sturdy material having low friction and low dielectric properties would be suitable for the purposes of the present invention.

The planar support member 12 includes two holes 36 and 38. The holes 36 and 38 preferably have the copper cladding removed from the immediate vicinity of the holes. Alternatively, an insulating grommet could be placed in the holes 36 and 38. First and second electrically conductive output terminals 40 and 42, respectively, are inserted in the holes 36 and 38. The output terminals 40 and 42 include connector means 44 and 46, respectively, for connecting the terminals 40 and 42 to a suitable capacitance bridge. The connectors 44 and 46 should be selected to match the input connections on the particular capacitance bridge used. The connectors 44 and 46 are securely mounted on a support member 12 by means of screws 48.

Electrically conductive spring means including first and second substantially U-shaped springs 50 and 52, respectively, are secured attached to the output terminals 40 and 42, respectively, preferably by soldering. The springs 50 and 52 are preferably made of beryllium copper, although any material having both high electrical conductivity and a high degree of resiliency will suffice for the purposes of the present invention.

The holding device of the present invention further includes first and second movable electrical contacts 54 and 56, respectively, for holding an electrical component therebetween. The contacts 54 and 56 are preferably a pair of gold-plated copper jaws; however, any contact having both high electrical conductivity and high resistance to the formation of oxides would be suitable for the purposes of the present invention. The jaws 54 and 56 have necked down rear portions 58 and 60, respectively, which are securely attached to the ends 62 and 64 of springs 50 and 52, respectively, preferably by soldering. The necked down rear portions 58 and 60 enable the springs 50 and 52 to apply forces to the jaws 54 and 56 fairly close to their centers of gravity, thereby minimizing any torsional effects on the jaws 54 and 56. The jaws 54 and 56 each included a planar contact surface 66 and 68, respectively, for holding an electrical component 70 therebetween. The jaws 54 and 56 further include protruding foot portions 72 and 74, respectively.

In order to utilize the holding device of the present invention, the jaws 54 and 56 are moved in opposite directions along the guide means 26 and an electrical component, the capacitance of which is to be measured is inserted between the planar contact surfaces 66 and 68. The component 70 will usually be a chip capacitor or the like. The jaws 54 and 56 may then be released and the springs 50 and 52 will urge the jaws 54 and 56 into an abutting relationship to thereby hold the electrical component 70 between the planar contact surfaces 66 and 68. Since the springs 50 and 52 are also electrically connected to the first and second output terminals 40 and 42, respectively, the component 70 is now electrically connected to the output terminals 40 and 42 and is ready to be measured.

It should be noted that in addition to urging the jaws 54 and 56 into an abutting relationship, the springs 50 and 52 also urge the jaws 54 and 56 in an outward direction against the Teflon track 30. However, the foot portions 72 and 74 of the jaws 54 and 56, respectively, are trapped against the side wall 32 of the track 30 and prevented from twisting by the linear lip portion 34 of the track 30. Thus, the track 30 serves to maintain the jaws 54 and 56 along a linear path of travel. Furthermore, since the planar contact surfaces 66 and 68 are perpendicular to the protruding foot portions 72 and 74, the planar contact surfaces 66 and 68 are maintained in a parallel relationship by the guide means 26. The jaws 54 and 56 are positioned to slide under the cut-out portion 18 of the support member 16 to thus obtain a maximum shielding effect between the components on one side of the support 16 and the components on the other side.

The springs 50 and 52 are preferably identical in structure and therefore exert an equal force on the jaws 54 and 56, respectively. Thus, the holding device of the present invention is self-centering, assuring a great deal of consistency between successive measurements of capacitance. Additionally, the inherent or parasitic capacitance of the holding device of the present invention is extremely low, thus permitting the accurate measurement of extremely small capacitors. The inherent capacitance of the holding device of the present invention is between 1 and 3pf, depending upon the size of the particular jaws utilized. The capacitor being measured is merely held in place between the planar surfaces 66 and 68 and thus is not in any way altered or damaged during the process. Nonetheless, the capacitor is held with sufficient security to assure electrical contact that is excellent for measuring purposes.

I wish it to be understood that I do not desire to be limited to the exact details of the discussion shown and described, for obviously modifications can be made by a person skilled in the art.

I claim:

1. A device for holding small electrical components comprising:
   a. a combined support and electrostatic shield means;
   b. first and second movable electrical contacts for holding an electrical component therebetween;
   c. first and second electrically conductive output terminals supported by said support means;
   d. first and second electrically conductive spring means for urging said electrical contacts into an abutting relationship to thereby hold said electrical component between said first and second electrical contacts, said first spring means being connected to said first electrical contact and said first output terminal and said second spring means being connected to said second electrical contact and said second output terminal to thereby electrically connect said electrical component with said first and second output terminals;
   e. a guide means including a Teflon track having a linear lip portion extending therefrom; securely attached to said support means for maintaining said electrical contacts along a linear path of travel; and
   f. said combined support and shield means further comprises a planar electrostatic shield member interposed between said first and second spring means.

2. A holding device as set forth in claim 1 wherein each of said first and second electrical contacts includes a protruding foot means for engaging said Teflon track.

3. A holding device as set forth in claim 1 wherein said first and second springs are made of beryllium copper.

4. A holding device as set forth in claim 1 wherein said planar member includes a cut-out portion and said linear path extends through said cut-out portion.

5. A holding device as set forth in claim 1 wherein said first and second electrical contacts each include a planar contact surface.

6. A holding device as set forth in claim 5 further including means for maintaining said planar contact surfaces in a parallel relationship.

7. A holding fixture as set forth in claim 5 wherein said first and second electrical contacts each comprise a pair of gold plated copper jaws and wherein said planar contact surfaces are parallel.

* * * * *